United States Patent [19]

Guisinger

[11] Patent Number: 4,510,459

[45] Date of Patent: Apr. 9, 1985

[54] WIDEBAND RECORD AMPLIFIER

[75] Inventor: Barrett E. Guisinger, Saratoga, Calif.

[73] Assignee: Sony Corporation, Tokyo, Japan

[21] Appl. No.: 440,445

[22] Filed: Nov. 10, 1982

[51] Int. Cl.³ .............................................. H03F 3/30
[52] U.S. Cl. .................................... 330/265; 330/255; 330/311; 360/68
[58] Field of Search ................ 330/255, 263, 265, 311; 360/68

[56] References Cited

U.S. PATENT DOCUMENTS 3,745,477 7/1973 Freeborn ........................ 330/255 X

FOREIGN PATENT DOCUMENTS 53-63955 6/1978 Japan ................................... 330/265

Primary Examiner—James B. Mullins
Attorney, Agent, or Firm—Philip M. Shaw, Jr.

[57] ABSTRACT

A wideband recording amplifier having push-pull amplification stages in which each stage comprises a common-base configured transistor amplifier driving an emitter-follower configured amplifier and with a negative feedback signal being applied to the base inputs of the common-base configured amplifiers.

5 Claims, 5 Drawing Figures

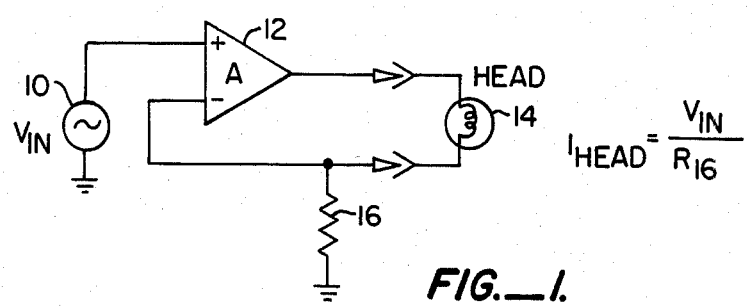
FIG._1.
PRIOR ART
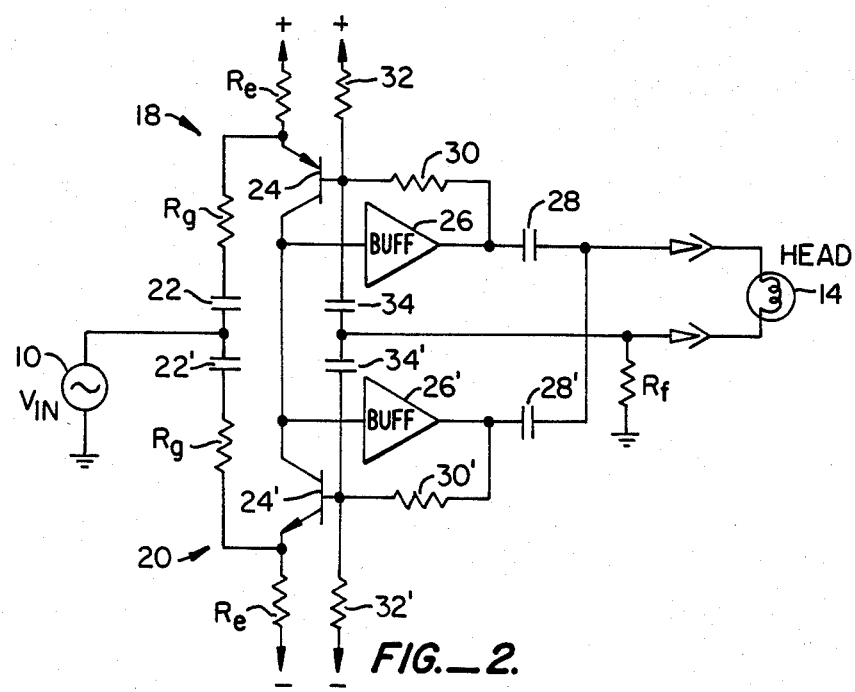
FIG._2.
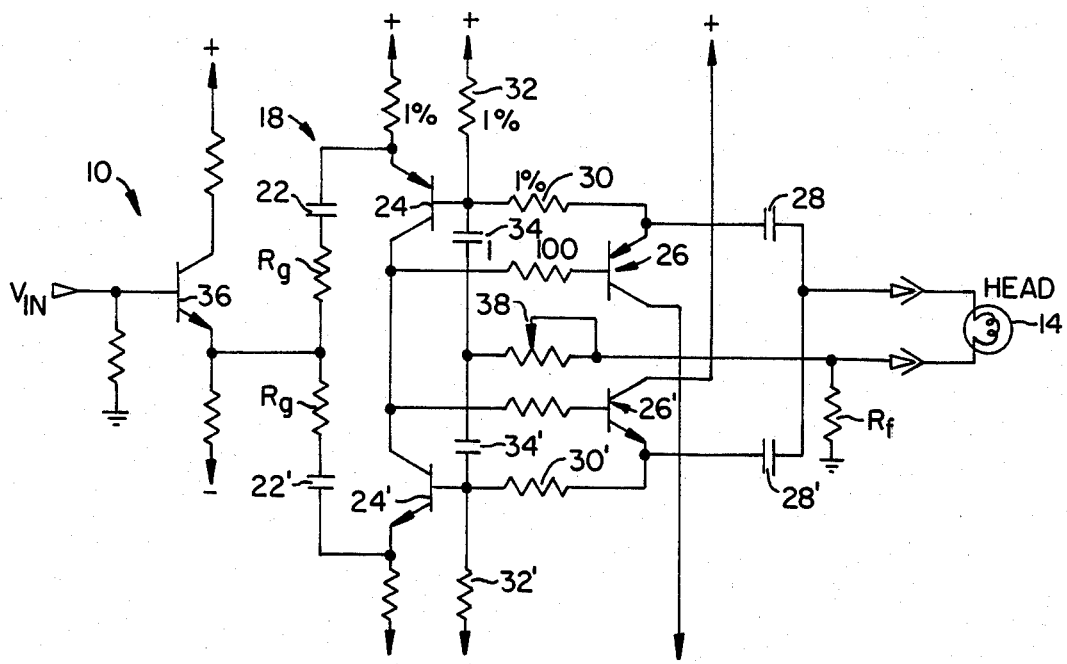
FIG._3.

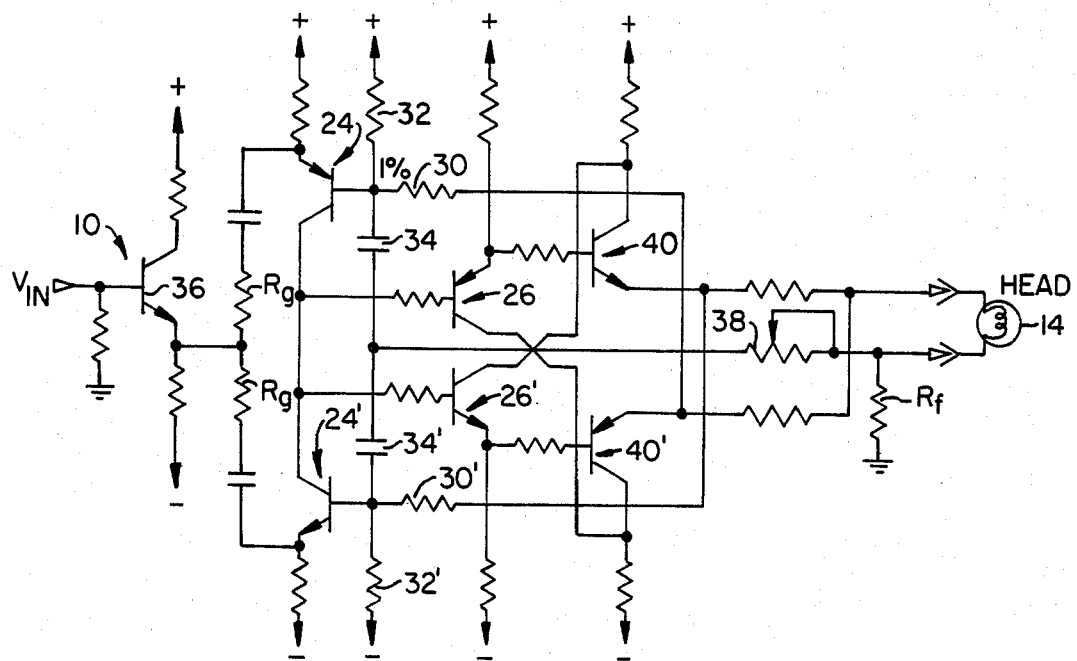
FIG._4.
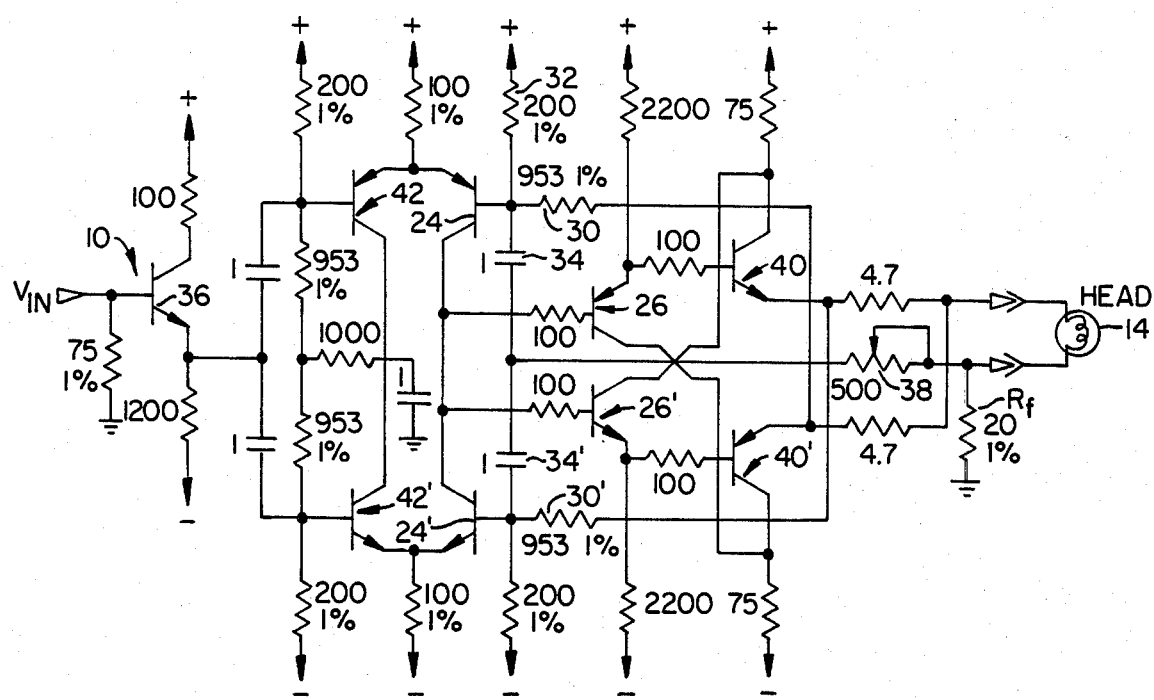
FIG._5.

WIDEBAND RECORD AMPLIFIER

TECHNICAL FIELD

This invention relates to a record amplifier for use in magnetic recording apparatus and, more particularly, to a wideband record amplifier.

BACKGROUND ART

In record amplifiers, it is desirable to have a closed feedback system involving the magnetic recording head so that any change in the head parameters are automatically compensated for by negative feedback. One problem with a negative feedback circuit, however, is that all such circuits have a finite amount of time delay for signals passing through the amplifier. Provided that this circuit delay is small compared to the period of the signal, this does not present a problem. However, as the frequency of the signal increases, that is at higher bandwidths, the circuit delay begins to approach one half of the period of the signal which is the equivalent of 180° of phase shift. Thus the output signal from the amplifier is inverted with respect to the input signal. When a portion of this phase shifted output signal is negatively fed back, it amounts to positive feedback and causes oscillation.

The problem with prior art record amplifiers has been that an adequate amount of signal amplification was not achievable without so much circuit delay that the bandwidth of the amplifier was severely limited by the foregoing principle. The best way, of course, to reduce the amount of signal delay is to have the minimum number of amplifying components in the circuit, but without sacrificing overall signal gain. The present invention achieves high gain with a minimum number of circuit components to thereby reduce the circuit signal delay and thus increase the bandwidth.

DISCLOSURE OF INVENTION

The above and other disadvantages of prior art amplifiers used for driving a magnetic recording head in response to an input signal are overcome by the present invention which comprises a pair of common-base configured transistor amplifiers which operate in push-pull fashion. Each of these common-base amplifiers has a separate emitter input for receiving the input signal, a separate base input for receiving a feedback signal, and a separate collector output, with the two collector outputs being directly connected together. A pair of emitter-follower configured amplifiers are each connected between the collector outputs and the recording head. Negative feedback means are connected between the recording head and the base inputs to the common-base configured amplifiers for providing negative feedback.

In a preferred embodiment, each emitter-follower configured amplifier is comprised of a pair of direct coupled PNP and NPN type transistors. In still another embodiment, a pair of common-emitter configured input amplifiers are each connected in series between an input signal source and the emitter-input of the common-base configured amplifiers.

Thus, by the use of the common-base configured amplifiers having directly connected together collectors, an extremely high gain is achieved with a minimum of amplifier components. The purpose of the emitter-follower amplifier is to provide sufficient power to drive the recording head. In all, a signal delay of only two devices is recognized in the present invention as compared with a typical delay of five to six devices in prior art record amplifiers of this type.

It is therefore an object of the present invention to provide a high gain record amplifier with a minimum of signal delaying devices.

It is yet another object of the invention to provide a high gain, wideband record amplifier.

The foregoing and other objectives, features and advantages of the invention will be more readily understood upon consideration of the following detailed description of certain preferred embodiments of the invention, taken in conjunction with the accompanying drawings.

BRIEF DESCRIPTION OF DRAWINGS

FIG. 1 is a schematic diagram of a prior art record amplifier utilizing negative feedback.

FIG. 2 is a schematic diagram of a wideband record amplifier according to the invention.

FIG. 3 is a more detailed schematic diagram of the circuit depicted in FIG. 2.

FIG. 4 is a schematic diagram of a second embodiment of the record amplifier according to the invention.

FIG. 5 is a schematic diagram of a still another embodiment of a record amplifier according to the invention.

BEST MODE FOR CARRYING OUT THE INVENTION

Referring now more particularly to FIG. 1, a prior art record amplifier circuit is depicted as comprising a signal source 10 connected between the circuit ground and the non-inverting input of a differential amplifier 12. A magnetic recording head 14 is connected in series between the output of the amplifier 12 and the non-inverting input of the amplifier. A feedback resistance 16 is connected between the inverting input amplifier and the circuit ground. The current through the head 14 is equal to the input voltage divided by the feedback resistance 16. It will be understood that the amplifier 12 is symbolic of many stages of amplification in a practical magnetic recording amplifier circuit. Such stages introduce a substantial amount of signal delay compared to the operating frequency such that the bandwidth is restricted as described above.

Referring now more particularly to FIG. 2, a record amplifier according to the invention is illustrated. In this circuit, the signal source 10 is connected between the circuit ground and the inputs to a pair of common-base configured transistor amplifiers 18 and 20. Each amplifier 18 and 20 is comprised of a capacitor 22 connected in series with an input resistance $R_g$ between the source 10 and an emitter contact of a transistor 24. The amplifier 18 has a PNP transistor 24 whereas the amplifier 20 has an NPN transistor 24'.

The collector output of the transistor 24 is directly connected to the collector output of the transistor 24' and to the input of an emitter-follower buffer amplifier 26 whose output is connected through a capacitor 28 to one lead of the recording head 14. Similarly, the collector output of the transistor 24' is connected through a buffer amplifier 26' in series with a capacitor 28' to the same lead of the recording head 14.

The other lead of the recording head 14 is connected through capacitors 34 and 34' to the base inputs of the transistors 24 and 24', respectively. The base inputs of the transistors 24 and 24' are also connected through resistors 30 and 30' to the outputs of the buffer amplifiers 26 and 26', respectively. The base inputs of the transistors 24 and 24' are also connected to plus and minus bias sources through resistors 32 and 32'. The resistor combinations 30 and 32 and 30' and 32' provide for DC bias stability to the common-base configured transistor amplifiers 24 and 24'. A feedback resistance $R_f$ is connected between the circuit ground and the other lead of the magnetic recording head 14. The negative feedback voltage thus developed across the resistance $R_f$ is applied to the base input leads of the common-base configured transistor amplifiers 24 and 24'.

The current through the head 14, which is primarily inductive, can be defined as $$I_{HEAD} = \frac{V_{in}}{\frac{R_g}{2} + R_f}$$

From the above equation, it can be seen that the current through the head is proportional to the magnitude of the input signal. In addition, the current is substantially independent of the inductance of the head. Thus, a constant head current is maintained for a given input signal despite variations in the head inductance caused by head wear and the like.

As is clear from the circuit diagram, the signal encounters a delay of only one transistor in the common-base stage plus the delay caused by the emitter-follower buffer amplifier in passing through the recording amplifier. This is because the circuits are connected in push-pull fashion and only one set of amplifiers is operating at a time. The absence of any collector load resistors in the amplifiers 24 and 24' allows them to operate at high gain and high bandwidths. It should also be noted that, while the resistances 30, 32 and 30', 32' provide stabilization for the direct current operating point of the amplifiers, the operational feedback voltage developed across the resistance $R_f$ is almost independent of the direct current feedback signals developed by these resistor combinations.

Referring now more particularly to FIG. 3, the embodiment in FIG. 2 is shown in greater detail. Here it can be seen that the input source generator 10 is actually an emitter-follower transistor amplifier 36. The emitter-follower buffer amplifiers 26 and 26' are comprised of emitter-follower configured PNP and NPN transistors 26 and 26', respectively.

A rheostat 38 is connected in series in the negative feedback circuit to control the amount of the feedback. In this figure, it is even clearer that the transistors 24 and 24' act as common emitter configured amplifiers for purposes of amplifying the negative feedback signal and as common-base configured amplifiers for amplifying the input signal $V_{in}$.

Referring now more particularly to FIG. 4, still another embodiment of the invention is illustrated. In this embodiment, the emitter-follower stages 26 and 26' are each direct-coupled to separate, second emitter-follower amplification stages 40 and 40'. The transistors of the stages 40 and 40' are of opposite conductivity type to the transistors of the stages 26 and 26', respectively. Thus PNP transistor amplifier 26 is direct current coupled to NPN transistor amplifier 40, for example. The emitter output leads of the stages 40 and 40' are then connected together to one side of the recording head 14 whose other lead is connected through the rheostat 38 to the base input leads of the amplifiers 24 and 24' through the capacitors 34 and 34'. The biasing resistors 30 and 30', instead of being connected to the emitter leads of the amplifiers 26 and 26', are connected to the emitter leads of the opposing emitter-follower amplifiers 40' and 40, respectively.

The basic difference between the embodiments of FIGS. 3 and 4 is that the embodiment of FIG. 4, with the same standing current in the output stages, will drive a larger current in the recording head 14. It is true that the signal time delay of still one more amplifying stage has been added, but the circuit still has far less delay than prior art circuits of this type.

Referring now more particularly to FIG. 5, still another embodiment of the invention is shown. This embodiment is substantiallly similar to that shown in FIG. 4, however, separate additional stages of direct coupled emitter-follower amplification 42 and 42' have been inserted between the emitter input leads of the amplifiers 24 and 24' and the emitter output of the input amplifier 36. The purpose of this addition is to increase the open loop gain of the circuit so that heavier feedback can be put around the basic amplifier circuits 24, 26, 40 and 24', 26' and 40'. By using the embodiment of FIG. 5, maximum bandwidth can be achieved, on the order of 100 mega-Hertz. Although the stages of amplification 42, 42' add to the signal delay, this signal delay is not within the feedback loop and, thus, does not restrict the bandwidth of the amplifier.

The terms and expressions which have been employed here are used as terms of description and not of limitation and there is no intention, in the use of such terms and expressions, of excluding equivalents of the features shown and described, or portions thereof, it being recognized that various modifications are possible within the scope of the invention as claimed.

I claim:

1. A wideband amplifier for driving a load which is primarily inductive in response to an input signal, said amplifier comprising;
    a circuit ground;
    a pair of common-base configured transistor amplifier stages operating in push-pull fashion, the transistors being of opposite polarity and each having a separate emitter input for receiving the input signal, a separate base input for receiving a feedback signal and a separate collector output the two collector outputs being directly connected together;
    a pair of buffer amplifier stages, each having an input coupled to said connected together collector outputs of said common-base configured amplifier stages and an output connected in series with the load to the circuit ground;
    a feedback resistor connected in series between the load and the circuit ground such that substantially all of the current passing through the load also passes through the feedback resistor; and
    means for applying the voltage developed across the feedback resistor to the base inputs of the common base configured transistor amplifier stages.

2. The amplifier of claim 1 wherein said buffer amplifier stages comprise emitter-follower configured transistor amplifier stages.

3. The amplifier of claim 2 wherein said buffer amplifier stages include a PNP-type transistor and a NPN-type transistor.

4. The amplifier of claim 1 further comprising a a pair of emitter-follower configured transistor amplifier stages which are each connected in series between a source of the input signal and a separate one of the emitter inputs of the common-base configured amplifier stages.

5. A wideband amplifier as recited in claim 1 wherein the means for applying the voltage developed across the feedback resistor to the base inputs comprises a pair of capacitors separately connected between the base inputs and the juncture of the feedback resistor and the load.

* * * * *